(12) United States Patent
Ohata

(10) Patent No.: US 11,646,127 B2
(45) Date of Patent: May 9, 2023

(54) FIBRILLATED LIQUID CRYSTAL POLYMER POWDER, METHOD OF PRODUCING FIBRILLATED LIQUID CRYSTAL POLYMER POWDER, PASTE, RESIN MULTILAYER SUBSTRATE, AND METHOD OF PRODUCING RESIN MULTILAYER SUBSTRATE

(71) Applicant: Murata Manufacturing Co., Ltd., Kyoto (JP)

(72) Inventor: Hiroyuki Ohata, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 1131 days.

(21) Appl. No.: 16/190,266

(22) Filed: Nov. 14, 2018

(65) Prior Publication Data

US 2019/0080817 A1 Mar. 14, 2019

Related U.S. Application Data

(60) Division of application No. 14/750,365, filed on Jun. 25, 2015, now abandoned, which is a continuation of
(Continued)

(30) Foreign Application Priority Data

May 22, 2013 (JP) ................................. 2013-107835

(51) Int. Cl.
*B32B 27/00* (2006.01)
*B32B 37/00* (2006.01)
(Continued)

(52) U.S. Cl.
CPC ............ *H01B 3/307* (2013.01); *B32B 27/08* (2013.01); *B32B 37/06* (2013.01); *B32B 37/10* (2013.01);
(Continued)

(58) Field of Classification Search
CPC .. H01B 3/00; H01B 3/30; H01B 3/307; B32B 27/00; B32B 27/08; B32B 37/00;
(Continued)

(56) References Cited

U.S. PATENT DOCUMENTS 5,454,910 A 10/1995 Yoon
5,472,798 A * 12/1995 Kumazawa ............. B32B 7/023
442/132
(Continued)

FOREIGN PATENT DOCUMENTS

CN 1551828 A 12/2004
CN 101951733 A 1/2011
(Continued)

OTHER PUBLICATIONS

Chinese Office Action for Chinese Patent Application No. 201810328310.4, dated May 26, 2020.
(Continued)

*Primary Examiner* — Jacob T Minskey
*Assistant Examiner* — Matthew Hoover
(74) *Attorney, Agent, or Firm* — Pearne & Gordon LLP

(57) ABSTRACT

A fibrillated liquid crystal polymer powder containing fibrillated liquid crystal polymer particles. A paste containing a dispersion medium and the fibrillated liquid crystal polymer powder. A method of producing the fibrillated liquid crystal polymer powder. A resin multilayer substrate obtained by laminating a plurality of resin sheets including at least one layer of a liquid crystal polymer sheet. On a surface of at least one layer of the liquid crystal polymer sheet, a thickness adjustment layer made of a fibrillated liquid crystal polymer powder containing fibrillated liquid crystal polymer particles is provided in a region insufficient in thickness when at least the plurality of resin sheets are laminated.

2 Claims, 7 Drawing Sheets

Related U.S. Application Data application No. PCT/JP2014/061031, filed on Apr. 18, 2014.

(51) Int. Cl.
| | |
|---|---|
| *C08J 3/00* | (2006.01) |
| *H01L 23/00* | (2006.01) |
| *H05K 3/00* | (2006.01) |
| *H01B 3/30* | (2006.01) |
| *H01L 23/14* | (2006.01) |
| *H01L 23/498* | (2006.01) |
| *H05K 3/46* | (2006.01) |
| *B32B 27/08* | (2006.01) |
| *C08J 3/12* | (2006.01) |
| *B32B 37/24* | (2006.01) |
| *B32B 37/06* | (2006.01) |
| *B32B 37/10* | (2006.01) |
| *H05K 1/18* | (2006.01) |

(52) U.S. Cl.
CPC ............... *B32B 37/24* (2013.01); *C08J 3/12* (2013.01); *H01L 23/145* (2013.01); *H01L 23/49894* (2013.01); *H05K 3/4632* (2013.01); *B32B 2037/243* (2013.01); *B32B 2250/24* (2013.01); *B32B 2255/10* (2013.01); *B32B 2305/55* (2013.01); *B32B 2307/20* (2013.01); *B32B 2307/206* (2013.01); *B32B 2457/00* (2013.01); *B32B 2457/08* (2013.01); *C08J 2300/12* (2013.01); *H01L 23/49822* (2013.01); *H05K 1/185* (2013.01); *H05K 2201/0141* (2013.01); *H05K 2201/0195* (2013.01); *H05K 2201/09527* (2013.01); *H05K 2201/10636* (2013.01)

(58) Field of Classification Search
CPC ......... B32B 37/06; B32B 37/10; B32B 37/20; B32B 37/24; C08J 3/00; C08J 3/10; C08J 3/12; H01L 23/00; H01L 23/10; H01L 23/14; H01L 23/145; H01L 23/40; H01L 23/49; H01L 23/498; H01L 23/4989; H01L 23/49894; H05K 3/00; H05K 3/40; H05K 3/46; H05K 3/463; H05K 3/4632

See application file for complete search history.

(56) References Cited

U.S. PATENT DOCUMENTS

| | | | |
|---|---|---|---|
| 7,022,807 B2 | 4/2006 | Okamoto | |
| 7,094,359 B2 | 8/2006 | Okamoto | |
| 8,178,646 B2 | 5/2012 | Kohinata | |
| 2002/0048641 A1* | 4/2002 | Yamaguchi | B32B 7/12 428/480 |
| 2003/0029634 A1 | 2/2003 | Okamoto | |
| 2003/0082974 A1 | 5/2003 | Samuels et al. | |
| 2005/0136233 A1* | 6/2005 | Samuels | H05K 1/0366 428/212 |
| 2011/0005823 A1 | 1/2011 | Lee et al. | |
| 2011/0240353 A1* | 10/2011 | Kohinata | C08G 63/91 174/258 |

FOREIGN PATENT DOCUMENTS

| | | |
|---|---|---|
| CN | 102206352 A | 10/2011 |
| CN | 102917554 A | 2/2013 |
| EP | 0167682 A1 | 1/1986 |
| JP | 60-239600 A | 11/1985 |
| JP | H06-341014 A | 12/1994 |
| JP | H1046431 A | 2/1998 |
| JP | 2002-326312 A | 11/2002 |
| JP | 2002-348487 A | 12/2002 |
| JP | 2003-268121 A | 9/2003 |
| JP | 2004-043624 A | 2/2004 |
| JP | 2004-315678 A | 11/2004 |
| JP | 2010-077548 A | 4/2010 |
| JP | 2011-213802 A | 10/2011 |

OTHER PUBLICATIONS

Translation of International Search Report issued in Application No. PCT/JP2014/061031 dated Jul. 15, 2014.
Written Opinion issued in Application No. PCT/JP2014/061031 dated Jul. 15, 2014.
Office Action issued in Chinese Patent Application No. 201480003254 dated Jun. 2, 2016.

* cited by examiner

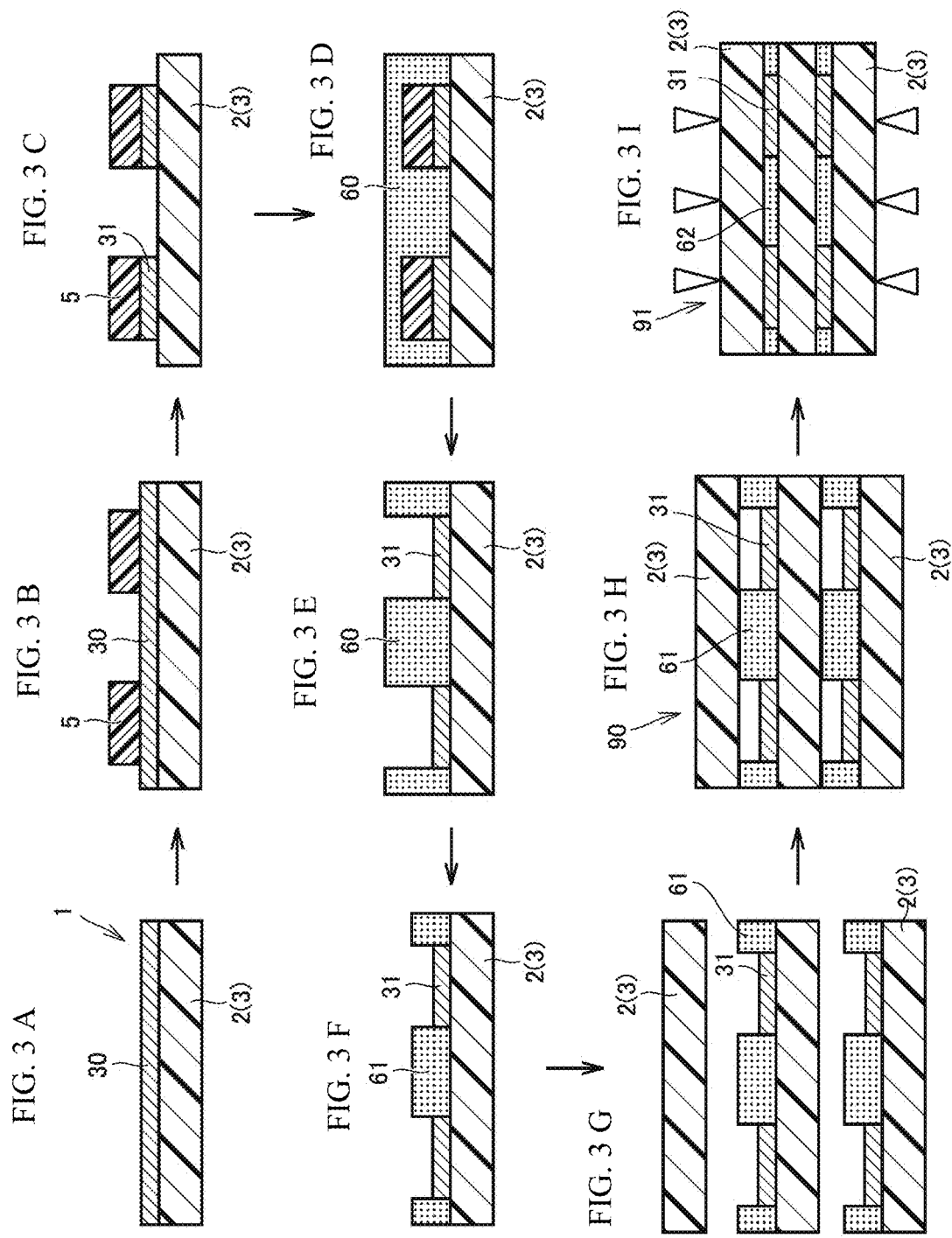

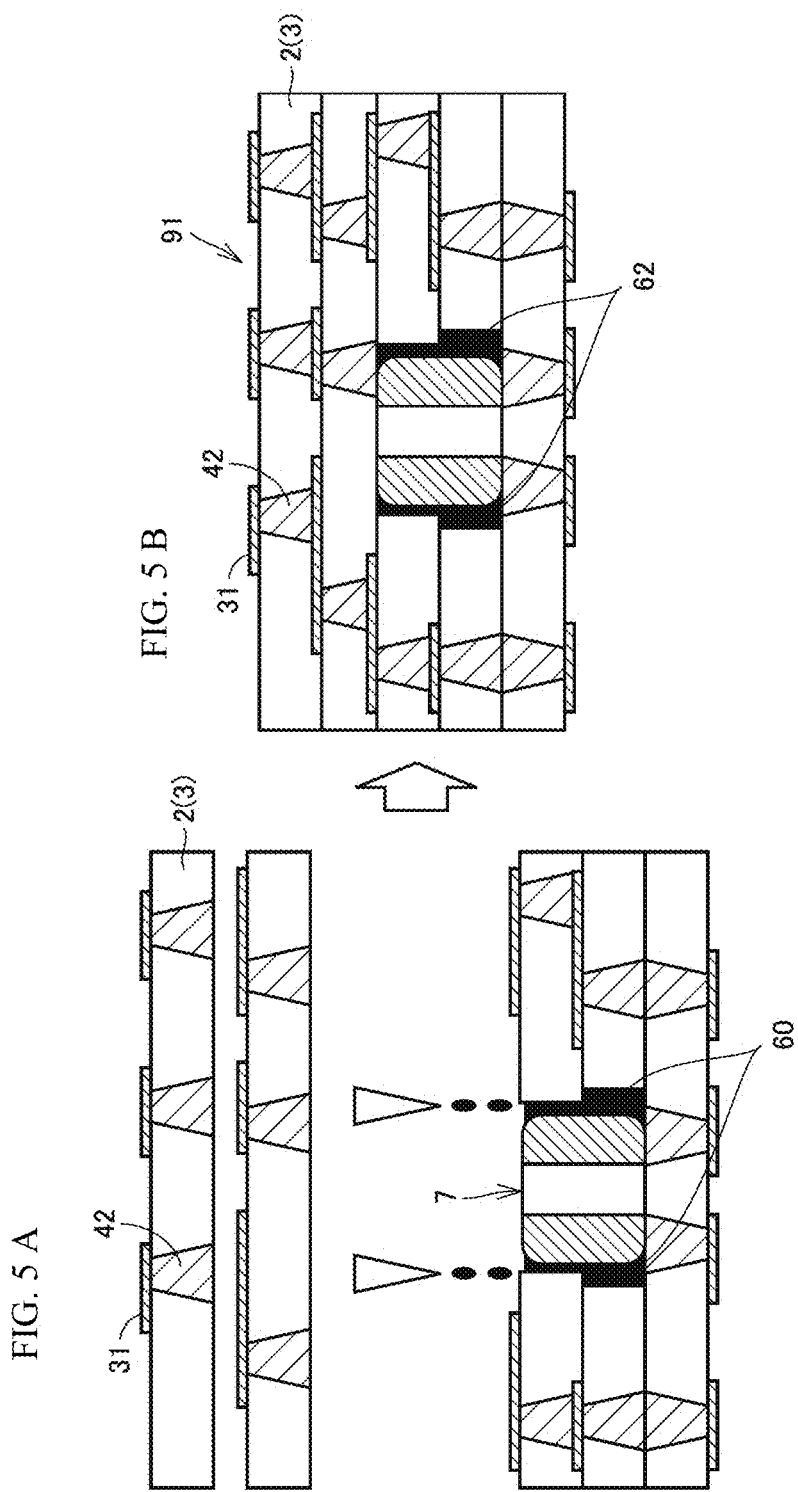

100× 100μm

100× 100μm

100×  100 μm

FIBRILLATED LIQUID CRYSTAL POLYMER POWDER, METHOD OF PRODUCING FIBRILLATED LIQUID CRYSTAL POLYMER POWDER, PASTE, RESIN MULTILAYER SUBSTRATE, AND METHOD OF PRODUCING RESIN MULTILAYER SUBSTRATE

This is a Division of U.S. patent application Ser. No. 14/750,365 filed on Jun. 25, 2015 which is a Continuation of International Application No. PCT/JP2014/061031 filed on Apr. 18, 2014, which claims priority from Japanese Patent Application No. 2013-107835 filed on May 22, 2013. The contents of these applications are incorporated herein by reference in their entireties.

BACKGROUND

Technical Field

The present disclosure relates to a fibrillated liquid crystal polymer powder, a method of producing a fibrillated liquid crystal polymer powder, a paste, a resin multilayer substrate, and a method of producing a resin multilayer substrate.

Background Art

As a method of producing a resin multilayer substrate, a method is known in which resin sheets made of a thermoplastic resin with a conductive pattern formed thereon are laminated, and heat and pressure are applied by a heat press plate to bond a laminate as a whole.

In a resin multilayer substrate obtained by such a method, there are some locations where the thickness is partially different because of the presence/absence of the conductive pattern, the presence/absence of a built-in part (a void due to the difference between cavity volume and volume of a built-in part, mismatching between the height of the part and substrate thickness), the level difference between a via and a resin portion (overfilling of a via paste, difference in amount of elastic deformation during compression, difference in thickness after cooling due to difference in coefficient of thermal expansion), or the like. However, the surface of a resin multilayer substrate is desirably as flat as possible for mounting thereon surface mount devices, such as IC chips and connectors, or for mounting this resin multilayer substrate on a printed circuit board or the like. A possible method for obtaining such a flat surface is to bring a member which is as flat as possible and which has high rigidity into contact with a surface of a substrate when bonding a plurality of resin sheets together through heating and compression.

PTD 1: Japanese Patent Laying-Open No. 2004-315678
PTD 2: Japanese Patent Laying-Open No. 2003-268121
PTD 3: Japanese Patent Laying-Open No. 60-239600
PTD 4: Japanese Patent Laying-Open No. 6-341014
PTD 5: Japanese Patent Laying-Open No. 2010-77548
PTD 6: Japanese Patent Laying-Open No. 2002-348487
PTD 7: Japanese Patent Laying-Open No. 2004-043624

SUMMARY

Technical Problem

Generally known as a suitable insulating material used for an electronic material is a "liquid crystal polymer" (LCP). LCP is a thermoplastic resin, from which a resin multilayer substrate can be obtained using the above-described method of producing a resin multilayer substrate. A film of LCP used as a substrate material is controlled to have a coefficient of thermal expansion close to that of metal, such as copper, used for a conductor by controlling the molecular orientation, thereby controlling dimensional changes and warping. If a flat and highly rigid member is brought into contact at the time of bonding through heating and compression in order for flattening, a phenomenon will occur in which the film of LCP directly under a portion which is essentially to be a convex portion is subject to a high pressure, and flows into a recessed portion which is less likely to be subject to pressure. By such a method, an obtained substrate has a disordered internal molecular orientation since LCP has a property that molecules are oriented in a resin flow direction, causing problems such as warping, deformation and exfoliation. Since internal conductors are also moved and deformed along with the resin flow, interlayer connections become misaligned, and the substrate no longer functions as a resin multilayer substrate. In order to flatten (smooth) the surface of a multilayer substrate, it is possible to apply a varnish obtained by dissolving this LCP in a solvent to a desired region (a location insufficient in thickness) of a multilayer circuit base material, such as a sheet, using a printing technique or the like.

However, as LCP used in the case of making an LCP varnish, a special LCP of comparatively low molecular packing with amide bond introduced into the molecular structure must be used, in order to obtain solubility in a typical solvent while maintaining liquid crystallinity. Since LCP with such bond and structure has a low gas barrier property and high moisture absorbency, low water absorbency which is one of principal merits of using LCP as part of a base material will be impaired. It is also possible to dissolve a common LCP in a special solvent such as halogen-substituted phenol. In this case, however, the solvent is expensive, and there is a problem in handling. A problem also arises in that, when applying it to a sheet, particularly a sheet of LCP, a sheet with a varnish applied thereto will also be dissolved (e.g., PTD 1: see Japanese Patent Laying-Open No. 2004-315678).

On the other hand, it is also possible to flatten the surface of a multilayer substrate by applying powder obtained by grinding LCP to a desired region (a location insufficient in thickness) of a multilayer circuit base material, such as a sheet, using a printing technique or the like.

For example, PTD 2 (Japanese Patent Laying-Open No. 2003-268121) describes forming a thin film for an electronic component using micropowder obtained by grinding liquid crystal polyester (LCP) by means of a powder coating method or a method using dispersion.

However, even when a dispersion only composed of an LCP powder and a dispersion medium is applied and dried, adhesiveness in the powder (between LCP particles) or adhesiveness with an LCP sheet is not fully obtained, and the LCP powder cannot be fully secured to the sheet in a step until heating and compression is performed after lamination. Therefore, it is necessary to add a binder resin to an LCP powder dispersion in order to improve adhesiveness, however, when a binder resin, which in many cases has high moisture absorbency, is used for a circuit board material, problems may arise in that characteristics may be changed by moisture absorption, a popcorn phenomenon may be caused by moisture absorption, and the like. Moreover, when bonding through heating and compression, it becomes a factor which inhibits adhesiveness between layers, and in addition, a cracked gas may be generated due to high temperatures during heating and compression, which can cause swelling.

PTD 3 (Japanese Patent Laying-Open No. 60-239600) discloses an invention regarding a synthetic paper through use of an LCP (liquid crystal polymer) pulp, and describes a method of applying a shearing force to an LCP fibrous material to manufacture pulp having fibrils. PTD 4 (Japanese Patent Laying-Open No. 6-341014) describes a method of crushing a highly-oriented extrusion molded material of LCP for fibrillation. PTD 5 (Japanese Patent Laying-Open No. 2010-77548 describes a method of dividing LCP fibers with a water flow for fibrillation.

According to all of the methods disclosed in PTD 3 to PTD 5, however, some physical power is applied to uniaxially-oriented fibers or a molded material for fibrillation. Therefore, a resultant fibrillated material has a fibrous form since cutting in the direction in which molecules are oriented is hardly performed in the fibrillating step, and fine fibrillated particles cannot be obtained.

PTD 6 (Japanese Patent Laying-Open No. 2002-348487) describes a method of grinding a biaxially-stretched film made of a mixture of LCP and a copolymer having reactivity with LCP to obtain an LCP filler composed of a plate-like trunk portion and a branch portion. PTD 7 (Japanese Patent Laying-Open No. 2004-043624) describes a method of obtaining flakes of an LCP film by a method, such as cutting, grinding, or beating.

According to each of the methods disclosed in PTD 6 and PTD 7, however, a film-like material is used as a start material. A plate-like material or flake-like material is merely obtained, and LCP particles having a large number of fibrils cannot be obtained.

In view of the above-described problems, in manufacturing of a resin multilayer substrate including an LCP sheet, the present disclosure provides an LCP powder that can be improved in bondability in the LCP powder (between LCP particles) and bondability between the LCP particles and the LCP sheet even if a resin component which can serve as a binder is not contained after applying a dispersion (paste) of the LCP powder to the LCP sheet and drying, and that can be secured to the sheet in a step until sheets are bonded together through heating and compression.

Solution to Problem

The present disclosure provides a fibrillated liquid crystal polymer powder containing fibrillated liquid crystal polymer particles.

The present disclosure also relates to a method of producing a fibrillated liquid crystal polymer powder containing fibrillated liquid crystal polymer particles, including, in the following order, a grinding step of grinding a biaxially-oriented liquid crystal polymer film to obtain the liquid crystal polymer powder, and a fibrillating step of crushing the liquid crystal polymer powder by a wet high-pressure crushing device to obtain the fibrillated liquid crystal polymer powder. Preferably, grinding using a freeze grinding method is performed in the grinding step.

The present disclosure also relates to a paste containing a dispersion medium and the above-described fibrillated liquid crystal polymer powder dispersed in the dispersion medium, and substantially not containing a binder resin component.

Preferably, the dispersion medium is a liquid that can be dried within a temperature range less than or equal to a melting point of the liquid crystal polymer particles.

More preferably, the paste further contains a liquid crystal polymer powder other than the fibrillated liquid crystal polymer powder.

The present disclosure also relates to a resin multilayer substrate obtained by laminating a plurality of resin sheets and then integrating them by thermocompression bonding. The plurality of resin sheets include at least one layer of a liquid crystal polymer sheet made of a liquid crystal polymer as a principal material. A conductive pattern is provided on a principal surface of at least one layer of the resin sheets. On a surface of at least one layer of the liquid crystal polymer sheet, a thickness adjustment layer made of a fibrillated liquid crystal polymer powder containing fibrillated liquid crystal polymer particles as a principal material is provided in a region insufficient in thickness when at least the plurality of resin sheets are laminated.

Preferably, the fibrillated liquid crystal polymer powder is made of an identical liquid crystal polymer material to the liquid crystal polymer sheet.

The present disclosure also relates to a method of producing a resin multilayer substrate obtained by laminating a plurality of resin sheets. The plurality of resin sheets include at least one layer of a liquid crystal polymer sheet made of a liquid crystal polymer as a principal material. The method includes, in the following order, a paste applying step of, on a surface of at least one layer of the liquid crystal polymer sheet, applying a paste containing a dispersion medium and a fibrillated liquid crystal polymer powder including liquid crystal polymer particles dispersed in the dispersion medium, and substantially not containing a binder resin component, to part of a region insufficient in thickness in a state where at least the plurality of resin sheets are laminated, a laminating step of laminating the plurality of resin sheets to obtain a laminate, and a thermocompression bonding step of applying pressure and heat to the laminate to bond the laminate by thermocompression to obtain a laminate including a thickness adjustment layer made of the paste.

Advantageous Effects

Since the fibrillated liquid crystal polymer powder (fibrillated LCP powder) of the present disclosure contains (fibrillated) LCP particles having a large number of fibrils, bondability between LCP particles and bondability between LCP particles and an LCP sheet after drying can be improved.

A paste containing the fibrillated LCP powder can be used as it is with favorable workability because of its high viscosity, without necessarily adding any other binder resin or the like. Since no binder resin is added, when a resin multilayer substrate is formed by bonding LCP sheets with the paste partially applied and dried together through heating and compression, it is not necessary to add a binder resin component which may inhibit adhesiveness between layers or may cause gas generation to cause deterioration in electrical characteristics. Problems, such as characteristics changes due to moisture absorption when applied as a circuit board material and occurrence of the popcorn phenomenon due to moisture absorption, are unlikely to occur.

Through fibrillation, LCP particles have low bulk density (having voids). Since particles are therefore broken down by compression at the time of thermocompression bonding of a laminate, it is not necessary to make particles fine to the same degree as a slight level difference of a resin multilayer substrate, and the resin multilayer substrate can be flattened even when the particles are large to a certain degree. In other words, since an applied film is compressed at the time of thermocompression bonding to be thin, even if the applied film is thick to some degree, a thickness adjustment layer having a thickness as intended is likely to be finally formed. There is also an advantage that the costs for making particles fine can be eliminated.

As described above, a resin multilayer substrate that exhibits favorable electrical characteristics and low water absorbency derived from LCP has favorable surface smoothness (flatness) and enables easy mounting of surface mount devices thereon can be obtained.

BRIEF DESCRIPTION OF DRAWINGS

FIGS. 3A-3I show respective steps of a method of producing the resin multilayer substrate according to one embodiment of the present disclosure.

FIGS. 5A and 5B show explanatory views of a thickness adjustment layer in the resin multilayer substrate having built-in electronic components.

DESCRIPTION OF EMBODIMENTS

Figure 1:
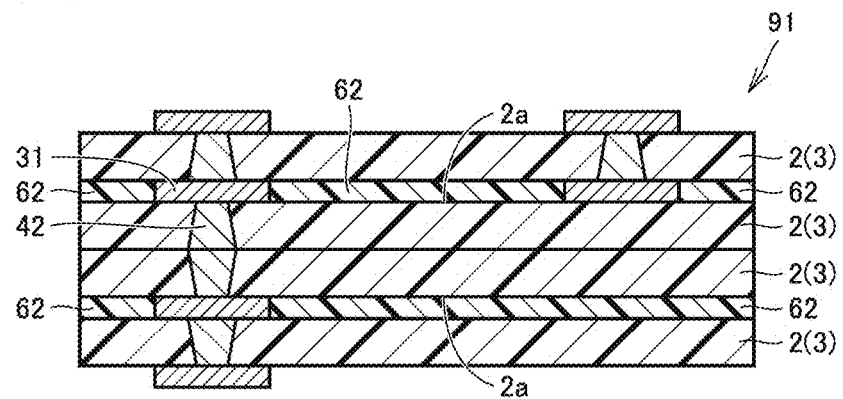
FIG. 1 is a cross sectional view of a resin multilayer substrate according to one embodiment of the present disclosure.

Hereinafter, one embodiment of the present disclosure will be described with reference to the drawings. In the drawings of the present disclosure, the same or corresponding portions have the same reference characters allotted. Dimensional relationships, such as length, width, thickness, and depth, have been changed appropriately for clarification and simplification of the drawings, and do not represent actual dimensional relationships.

Fibrillated LCP Powder

A fibrillated LCP powder of the present disclosure contains LCP particles having a large number of fibrils. "Fibrillated liquid crystal polymer particles" refer to particles made of a liquid crystal polymer having a large number of fibrils (e.g., fibril-like fibrous branches, a network structure composed of fibrils), all the particles having been substantially fibrillated. That is, such a material that a fibril has a branch partially extending from an elongated LCP flake is not contained.

Since the LCP particles contained in the fibrillated LCP powder have a large number of fibrils, they have a large number of voids in proximity to the surface and have low bulk density. The whole fibrillated LCP powder has a bulk density of preferably 0.01 to 0.2, and more preferably 0.03 to 0.08.

In order to further improve adhesiveness between LCP particles and adhesiveness between LCP particles and an LCP sheet, at least part of the fibrillated LCP powder may have experienced a surface treatment by ultraviolet (UV) or plasma radiation. The surface treatment by ultraviolet radiation is more preferable than the surface treatment by plasma as the bondability improving effect is greater.

Method of Producing Fibrillated LCP Powder

A method of producing a fibrillated liquid crystal polymer powder of the present disclosure includes a fibrillating step of crushing a liquid crystal polymer powder by a wet high-pressure crushing device to obtain a fibrillated liquid crystal polymer powder.

The wet high-pressure crushing device is a device for causing a dispersion of raw material particles to pass through a narrow nozzle (chamber) under high pressure to crush the raw material particles by a shearing force or the like produced at that time. It may be a device that can cause a dispersion to pass through a narrow nozzle and can cause the dispersion to collide with some target under high pressure.

As such a wet high-pressure crushing device, a device as disclosed in, for example, Japanese Patent Laying-Open Nos. 2003-10663 and 2001-29776, in which a raw material supplied to a material supply port can be delivered under pressure to a device body, and can granulate and extract a substance in the raw material in this body, can be used. Here, a substance in a pressurized fluid is granulated to have a desired particle size (determined by particle size distribution) by a confluence collision and shunt current extension in a through-hole, a groove or the like. A fluid collision device as disclosed in Japanese Patent Laying-Open No. 2000-448 for causing a high-pressure fluid to collide with a hard object to granulate a substance contained in the fluid can be used. An example of a commercially available wet high-pressure crushing device is "Cavitation Mill Nano Dispersing System" available from Advanced Nano Technology Co., Ltd., for example.

By using the wet high-pressure crushing device, the fibrillated LCP powder can be obtained from an LCP powder raw material. By a method other than using the wet high-pressure crushing device, deformation of powder occurs, and fibrillated LCP particles are hardly produced.

The pressure when the LCP powder dispersion passes through the nozzle of the wet high-pressure crushing device is preferably more than or equal to 20 MPa, and more preferably, more than or equal to 50 MPa. In order to bring the pressure when the LCP powder dispersion passes through the nozzle to fall within such a desired region, the nozzle diameter and the applied pressure at the material supply port may be adjusted appropriately.

The dispersion medium used herein is not particularly limited as long as it is a liquid material in which an LCP powder can be dispersed, however, in order to remove the dispersion medium after fibrillation and to collect a fibrillated LCP powder, a dispersion medium whose boiling point does not exceed the melting point of LCP is preferable, and more preferably, a dispersion medium whose boiling point is less than or equal to the softening temperature of LCP is preferable. Examples of such a dispersion medium include ethanol, methanol, isopropyl alcohol, toluene, benzene, xylene, phenol, acetone, methyl ethyl ketone, diethyl ether, dimethyl ether, and hexane.

This production method includes a grinding step of grinding a film made of a biaxially-oriented LCP to obtain an LCP powder to be subjected to grinding (fibrillation) by the wet high-pressure crushing device, prior to the fibrillating step. For the passage through the nozzle of the wet high-pressure crushing device, it is necessary to grind the LCP powder to have a particle size smaller than the nozzle diameter. In the case of a uniaxially-oriented LCP (e.g., a pellet-like), for example, elongated flakes which are long in the orientation direction can be obtained even if it is ground, which cannot pass through the nozzle of the wet high-pressure crushing device. On the other hand, by grinding a film made of a biaxially-oriented LCP, a powdery (spherical) ground material having a comparatively small particle size (e.g., having a particle size of 0.1 μm to 300 μm) can be obtained. Thus, the material can pass through the nozzle of the wet high-pressure crushing device. In order to prevent the nozzle from clogging, it is preferable to grind the LCP powder such that the particle size thereof is smaller than or equal to about half of the nozzle diameter.

As the biaxially-oriented LCP film, a biaxially-stretched LCP film can be used. By using the biaxially-oriented LCP film as a raw material, an LCP powdery material having therein a large number of domains in which molecules in an amount of certain range are oriented in the same direction can be obtained efficiently. In the case where the biaxially-oriented LCP film is ground, an LCP powder whose constitution particles are close to a spherical shape rather than a fibrous shape can be obtained. In the case where a uniaxially-oriented LCP film (uniaxially-stretched LCP film) or a pellet-like LCP is used, elongated fibrous material (flakes) whose molecules are orientated in a certain direction and which is long in the orientation direction can be obtained, and it is also difficult to obtain a coating material for obtaining a stable applied film. Since a material powderized at the time of LCP polymerization has no domain formed therein, fibrillation which will be described later is difficult.

The crushed LCP powder is fibrillated by separation per internal domain, and a fibrillated LCP powder having a large number of fibrils is obtained. Crushing may be proceeded until a net-like material or microfilaments entirely made of fibrils alone are obtained.

The particle size of the fibrillated powder depends on the particle size of the LCP powder before fibrillation. Thus, by controlling the particle size of the LCP powder, the particle size of the fibrillated powder can be controlled in accordance with application. For example, in the case of obtaining a paste of the fibrillated LCP powder containing these fibrillated particles and forming an applied film by screen printing, the particles need to be made small in accordance with the mesh size as they need to pass through a mesh screen. In the case of using an ink jet printing machine, particles larger than the nozzle diameter must not exist for the passage through the nozzle. The fibrillated fibers made of uniaxially-oriented LCP cannot be used for such applications of passing through a mesh or a nozzle because they are too long and become entangled together to form a massive object.

In the above-described grinding step (the step of obtaining an LCP powder), various grinding devices can be used appropriately for grinding a film-like LCP. In the grinding step, however, grinding by means of a freeze grinding method is preferably performed. Grinding by means of the freeze grinding method refers to grinding an LCP film or the like in a frozen state. In this case, a liquid crystal polymer film can be ground smoothly, so that powder of fine particle diameter can be obtained efficiently. In order to grind a liquid crystal polymer in a frozen state, it is possible to roughly grind a tape-like film made of a liquid crystal polymer, for example, and feed it into a grinding device sequentially while pouring liquid nitrogen thereon.

Paste Containing Fibrillated LCP Powder

A paste of the present disclosure contains a dispersion medium and the above-described fibrillated LCP powder dispersed in the dispersion medium. That is, main constituents of the paste are the above-described fibrillated LCP powder and the dispersion medium in which the fibrillated LCP powder can be dispersed.

The dispersion medium used herein is preferably a liquid that can be removed by heating at or below the melting point of an LCP resin. Such a dispersion medium is preferably a liquid from which LCP can be evaporated without necessarily melting or decomposing. As such, a dispersion medium, ethanol, terpineol, butyllactone, isopropyl alcohol, or the like can be used, for example.

The paste of the present embodiment has high viscosity even if the added amount of a fibrillated LCP powder is small, and separation of the dispersion medium and powder is unlikely to occur (precipitation of powder is unlikely to occur) because the powder is bulky. Therefore, the paste can be used for forming various applied films without necessarily adding a resin component, such as another binder resin for imparting these characteristics, or another additive.

With the paste of the present embodiment, even after application to an LCP sheet and drying, the fibrillated LCP powder adheres favorably to the LCP sheet, and does not drop down in a subsequent processing step. For this reason, it is not necessary to add a binder resin into the paste. Moreover, since a typical polyester-based LCP resin not containing an amide bond can be used, the paste has low water absorbency and excellent electrical characteristics.

In the paste, an LCP powder not having been fibrillated (a non-fibrillated LCP powder) may be added in addition to the fibrillated LCP powder, for the purpose of improving fluidity and reducing costs. Similarly to the fibrillated LCP powder, at least part of the non-fibrillated LCP powder may be subjected to a surface treatment by ultraviolet or plasma radiation so as to further improve adhesiveness between LCP particles and adhesiveness between LCP particles and an LCP sheet.

The above-described paste is applied to a portion of the LCP sheet and dried to form an applied film in the shape of an LCP sheet, and then finally subjected to heating and compression for integration to be part of a resin multilayer substrate.

In this manner, by applying the paste on the surface of at least part (a region insufficient in thickness in the state where a plurality of resin sheets are laminated) of an LCP sheet and drying, the partial thickness of the resin multilayer substrate can be adjusted to flatten the surface.

By removing the dispersion medium of the paste by heating, only LCP remains as a residual component. Therefore, there is no component that inhibits adhesion in LCP (between LCP particles and between LCP particles and the LCP sheet) after heating and compression, and integration can be achieved favorably. Moreover, the electrical characteristics of an LCP substrate are not impaired since there is no component having high water absorbency.

Resin Multilayer Substrate

A resin multilayer substrate of the present disclosure is a resin multilayer substrate obtained by laminating a plurality of resin sheets and then integrating them by thermocompression bonding. The plurality of resin sheets include at least one layer of a liquid crystal polymer sheet made of a liquid crystal polymer as a principal material. A conductive pattern is provided on a principal surface of at least one layer of the resin sheets. On a surface of at least one layer of the liquid crystal polymer sheet, a thickness adjustment layer made of a fibrillated liquid crystal polymer powder containing fibrillated liquid crystal polymer particles as a principal material is provided in a region insufficient in thickness when at least the plurality of resin sheets are laminated.

Figure 2:
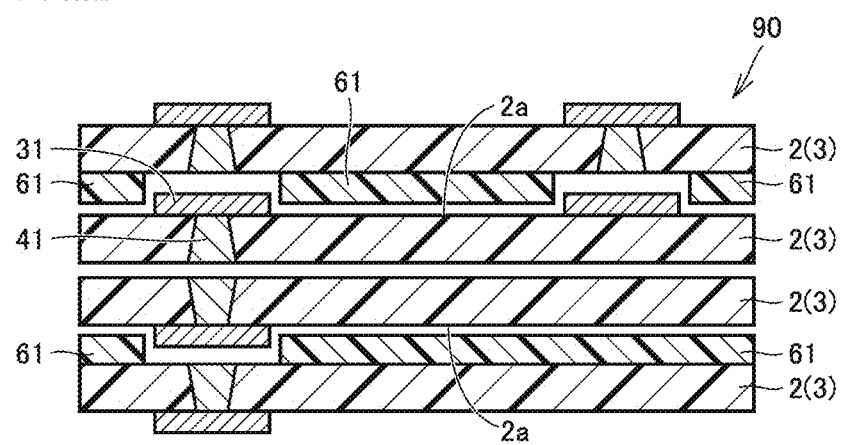
FIG. 2 is an exploded view of the resin multilayer substrate according to one embodiment of the present disclosure in the state before thermocompression bonding.

Referring to FIGS. 1 and 2, the resin multilayer substrate according to the present embodiment will be described below. A cross sectional view of this resin multilayer substrate is shown in FIG. 1, and an exploded view in the state before thermocompression bonding is shown in FIG. 2. As shown in FIG. 1, a resin multilayer substrate 91 according to the present embodiment is a resin multilayer substrate obtained by using a thermoplastic resin as a principal material and laminating a plurality of resin sheets 2 each having a principal surface 2a and subjecting them to thermocompression bonding for integration. Plurality of resin sheets 2 include resin sheet 2 having a conductive pattern 31 on principal surface 2a. In the example shown in the present embodiment, four layers of resin sheets 2 all correspond to resin sheet 2 having conductive pattern 31 on principal surface 2a. Moreover, the four layers of resin sheets 2 all correspond to an LCP sheet 3.

As shown in FIG. 2, on the surface of at least some LCP sheets 3 included in plurality of resin sheets 2, a paste containing the above-described fibrillated LCP powder is applied to a region insufficient in thickness in the state where plurality of resin sheets 2 are laminated. After applying this paste, a plurality of resin sheets are laminated in a dried state (an LCP powder layer 61). Finally, this paste after drying will be a thickness adjustment layer 62 by thermocompression bonding (FIG. 1).

"A region insufficient in thickness in the state where plurality of resin sheets 2 are laminated" refers to a region which will be insufficient in thickness without necessarily arranging thickness adjustment layer 62. This is, for example, a region where the arrangement density of patterning members (a conductor pattern, a via conductor, etc.) is low or a region where no built-in parts are built in, or the arrangement of built-in parts is sparse. The region where thickness adjustment layer 62 (or LCP powder layer 61) is arranged in FIGS. 1 and 2 corresponds to "a region insufficient in thickness in the state where plurality of resin sheets 2 are laminated." By applying the present disclosure, insufficiency in thickness as a resin multilayer substrate is also alleviated in these regions consequently.

It is not always necessary to apply the paste entirely to "a region insufficient in thickness in the state where plurality of resin sheets 2 are laminated." That is, the paste may be applied selectively, for example, to a portion of the region insufficient in thickness where a remarkable difference in thickness occurs. Alternatively, the paste may be applied to a portion other than the region insufficient in thickness.

When applying the paste, it is not always necessary to apply the paste in a thickness that completely solves the insufficiency in thickness. That is, if the paste is applied in a certain thickness, the insufficiency in thickness can be solved to some degree, and the effects of the present disclosure can be achieved.

In the present embodiment, the LCP powder layer is formed on the surface opposite to conductive pattern 31 as a patterning member at the time of lamination, however, LCP powder layer 61 may be formed on the same surface as conductive pattern 31 as a patterning member.

In this manner, in the resin multilayer substrate of the present embodiment, even when each resin sheet 2 has a difference in thickness by the local presence/absence of a patterning member or the like, the degree of flatness (surface smoothness) of the outermost surface of the laminate obtained by laminating these resin sheets 2 can fully be secured as shown in FIG. 1.

At least resin sheet 2 that is in contact with thickness adjustment layer 62 is preferably an LCP sheet having LCP as a principal material. By adopting this constitution, resin sheet 2 and thickness adjustment layer 62 both become layers of LCP in the laminated state, so that bondability between them is improved.

Method of Producing Resin Multilayer Substrate

A method of producing a resin multilayer substrate according to the present embodiment is a method of producing a resin multilayer substrate obtained by laminating a plurality of resin sheets. The plurality of resin sheets include at least one layer of a liquid crystal polymer sheet made of a liquid crystal polymer as a principal material, the method comprising, in the following order, a paste applying step of, on a surface of at least one layer of the liquid crystal polymer sheet, applying a paste containing a dispersion medium and a fibrillated liquid crystal polymer powder including liquid crystal polymer particles dispersed in the dispersion medium, and substantially not containing a binder resin component, to part of a region insufficient in thickness in a state where at least the plurality of resin sheets are laminated, a laminating step of laminating the plurality of resin sheets to obtain a laminate, and a thermocompression bonding step of applying pressure and heat to the laminate to bond the laminate by thermocompression to obtain a laminate including a thickness adjustment layer made of the paste.

The method of producing a resin multilayer substrate according to the present embodiment will now be described in detail with reference to FIGS. 3A-3I.

First, as shown in FIG. 3A, an LCP sheet 1 with a conductor foil in which a conductor foil 30 adheres to one side of LCP sheet 2 is prepared. LCP sheet 2 is made of LCP. However, all of resin sheets constituting a resin multilayer substrate do not need to be LCP sheets, but some resin sheets may be made of a resin material other than LCP, such as PEEK (polyetheretherketone), PEI (polyether imide), PPS (polyphenylenesulfide), or thermoplastic PI (polyimide). A sheet (substrate) made of a thermosetting resin, such as epoxy resin, may also be included.

Conductor foil 30 is made of an elemental metal such as Cu, Ag, Al, SUS, Ni, or Au, or an alloy of two or more different metals selected from among these metals, for example. The thickness of conductor foil 30 may be a thickness that allows for circuit formation, and is about more than or equal to 5 µm and less than or equal to 100 µm, for example. Conductor foil 30 has been subjected to a surface treatment so as to have a predetermined surface roughness Rz (e.g., 3 µm).

An operation of forming a conductive pattern and the like which will be described later may be proceeded after preparing resin sheet 1 with a plurality of strip-shaped conductor foils (in the form of individual substrates). As another method, large-sized resin sheet 1 with a conductor foil in which strip-shaped regions to be individually cut out later as a plurality of resin sheets are defined may be prepared, and an operation of forming a conductive pattern and the like which will be described later may be proceeded on the large-sized sheet, and then the sheet may be cut into strips. Herein, description will be continued assuming that strip-shaped resin sheet 1 with a conductor foil has already been cut out.

Although not shown in FIG. 3A, a via hole for charging a conductive paste 41 (see FIG. 2) at a location where connection between conductive patterns is required as will be described later. The via hole is formed to extend through resin sheet 2 by irradiating a surface of resin sheet 1 with a conductor foil on the side of resin sheet 2 with a carbon dioxide laser light. The via hole extends through resin sheet 2, but does not extend through conductor foil 30. Then, a smear in the via hole may be removed by a chemical treatment with permanganic acid or the like according to necessity. In order to form a via hole, laser light other than carbon dioxide laser light may be used, or a method other than laser light irradiation may be adopted.

A cavity, namely, a void, for accommodating electronic components may be formed in some resin sheets 2 by punching or the like, and after placing electronic components in the cavity, plurality of resin sheets 2 may be laminated. Then, it is possible to incorporate electronic components in a laminate.

Next, as shown in FIG. 3B, a resist film 5 is formed on the surface of conductor foil 30 on the side opposite to LCP sheet 3.

Next, conductor foil 30 is etched with resist film 5 used as a mask to remove a portion of conductor foil 30 that is not covered with resist film 5, as shown in FIG. 3C. Then, desired conductive pattern 31 is formed on one surface of resin sheet 2.

Next, resist film 5 is removed using a resist cleaning liquid, then as shown in FIG. 3D, a paste (an LCP paste 60) containing a dispersion medium and a fibrillated liquid crystal polymer powder dispersed in this dispersion medium and substantially not containing a binder resin component is selectively applied by printing to resin sheet 2 on the side of conductive pattern 31 (e.g., to a portion where conductive pattern 31 is absent) (a paste applying step). A state shown in FIG. 3E is thereby brought about. Then, LCP paste 60 is dried to form LCP powder layer 61 at a portion on resin sheet (LCP sheet) 2 where conductive pattern 31 is absent, as shown in FIG. 3F. Even in this state, in LCP powder layer 61, LCP particles as well as the LCP particles and the LCP sheet are bonded to some degree, which provides more excellent workability, such as conveyance to a next step, than in conventional cases.

Thereafter, the above-described via hole, if provided, is filled with conductive paste 41 (see FIG. 2) by screen printing or the like, although not shown in FIGS. 3A-3I. Although screen printing is performed from the lower surface in FIG. 3F, screen printing is actually performed with the upper and lower sides reversed such that the opening of the via hole is placed on the upper side.

The conductive paste preferably contains a suitable amount of metal powder that forms an alloy layer with a metal which is a material of conductive pattern 31 at a temperature at the time of thermocompression bonding of laminated resin sheets later (hereinafter referred to as a "thermocompression bonding temperature"). This conductive paste contains copper, namely, Cu as a principal component for exhibiting conductivity, and preferably contains at least one of Ag, Cu and Ni in addition to the principal component and at least one of Sn, Bi and Zn.

Although processing on a certain resin sheet 2 has been described by way of example, other resin sheets 2 are also subjected to similar processing to form desired conductive pattern 31 and LCP powder layer 61 appropriately, and to be filled with the conductive paste according to necessity. In this way, plurality of resin sheets 2 are prepared as shown in FIG. 3G.

Next, plurality of resin sheets 2 are laminated as shown in FIG. 3H (a laminating step). A laminate 90 is formed by laminating plurality of resin sheets 2. In this state, laminate 90 has not been bonded by thermocompression, but is in the state where resin sheet 2 are merely laminated.

Next, as shown in FIG. 3I, pressure and heat is applied to laminate 90 of plurality of resin sheets 2 to bond laminate 90 by thermocompression (a thermocompression bonding step). Specifically, for example, release materials are placed on the upper and lower surfaces of laminate 90, and press plates are further placed thereon to sandwich them from above and below for heating and pressurization. It is not indispensable to interpose the release materials above and below laminate 90. However, by thus using the release materials in step S4, an operation of removing resin multi-layer substrate 91 obtained after thermocompression bonding from between the press plates can be performed smoothly.

In this way, plurality of resin sheets 2 included in laminate 90 are bonded to each other by thermocompression, and resin multilayer substrate 91 is obtained. Simultaneously with this, the conductive paste is metalized by heating compression to be a via conductor 42 (see FIG. 1).

When these resin sheets 2 are bonded together by thermocompression, LCP powder layer 61 is compressed by heating, so that thickness adjustment layer 62 is formed. At this time, LCP particles constituting LCP powder layer 61 are adhered and bonded together by thermocompression bonding. At a location where LCP sheet 2 and LCP powder layer 61 are in direct contact with each other, LCP constituting LCP sheet 2 and the LCP particles constituting LCP powder layer 61 are bonded firmly by thermocompression bonding.

On the resin multilayer substrate obtained as described above, surface mount devices are mounted afterwards according to necessity.

In the present embodiment, on the surface of at least some resin sheets 2 of plurality of resin sheets 2, LCP powder layer 61 is formed by applying the paste to a region insufficient in thickness in laminate 90 as a whole, and plurality of resin sheets 2 having experienced such steps are laminated and bonded by thermocompression. Therefore, in the region where the thickness should have been insufficient in laminate 90 as a whole, the thickness of the whole laminate is compensated by the thickness of thickness adjustment layer 62. Therefore, even if individual resin sheets 2 have a difference in thickness due to the local presence/absence of a pattern, the degree of flatness of the outermost surface of the laminate obtained by laminating these resin sheets 2 can be secured sufficiently.

In the method of producing a resin multilayer substrate based on the present embodiment, at least one layer of plurality of resin sheets 2 is an LCP sheet having LCP as a principal material, and preferably, all of resin sheets 2 are LCP sheets. In this case, in the sate where plurality of resin sheets 2 are laminated, resin sheet 2 and thickness adjustment layer 62 both become LCP layers and have equal material characteristics. Thus, electrical characteristics of internal wiring lines and the like are unlikely to be affected.

The material of the biaxially-oriented LCP film is preferably the same as the principal material of LCP sheet 2. Assuming that the same material as the film-like liquid crystal polymer mainly constituting LCP sheet 2 is used as a biaxially-oriented film-like LCP, LCP sheet 2 and thickness adjustment layer 62 will be composed of the same type of liquid crystal polymers. Thus, resin multilayer substrate 91 can be obtained without necessarily affecting the characteristics of internal wiring lines and the like.

In the method of producing a resin multilayer substrate based on the above-described present embodiment, on the surface of at least some resin sheets 2 of plurality of resin sheets 2, the LCP paste of the present disclosure is applied and dried to form the thickness adjustment layer, thereby adjusting the thickness. However, the thickness adjustment layer formed by the LCP paste of the present disclosure is not limited to such layer formed on the surface of single-layer resin sheet 2.

Figure 4A:
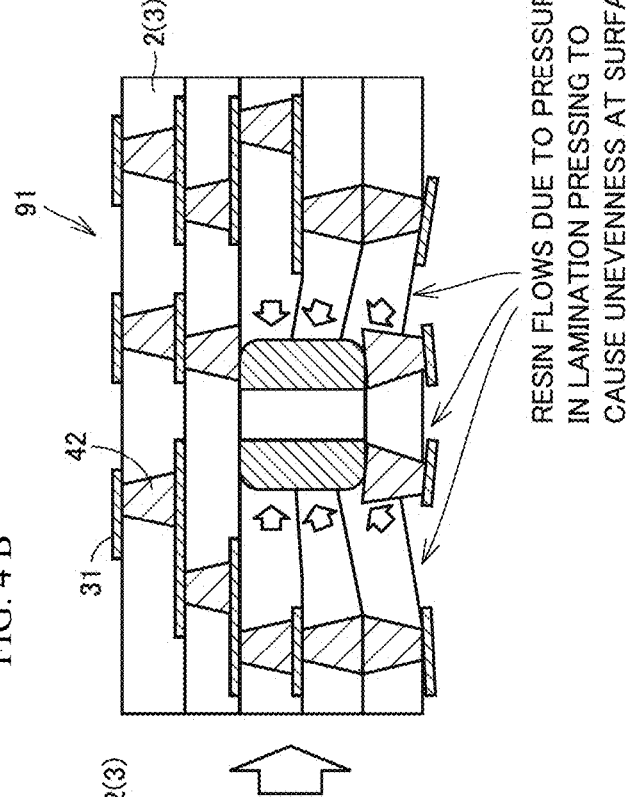
FIGS. 4A and 4B show explanatory views of a resin multilayer substrate having built-in electronic components.
Figure 4B:
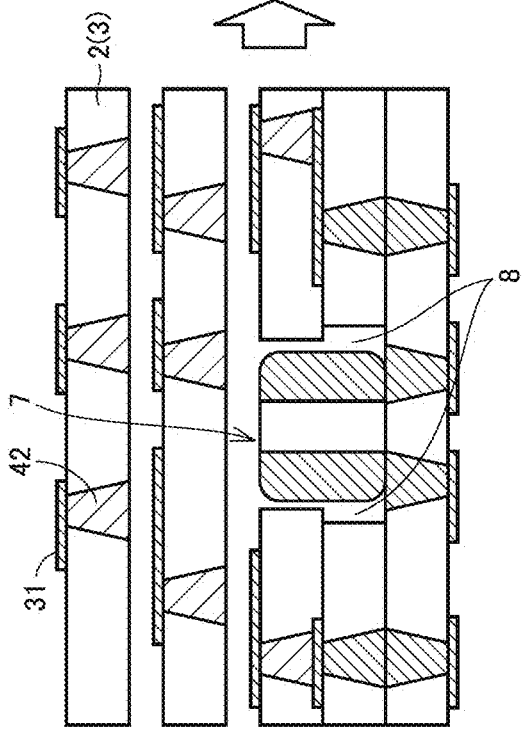

For example, referring to FIG. 4A, in the case of providing void (cavity) 8 in a resin multilayer substrate obtained by laminating plurality of LCP sheets 3 by partially cutting out (not forming) LCP sheets 3 and incorporating an electronic component 7 therein, the size of void 8 is sometimes made larger than the plane contour of electronic component 7 in order to incorporate electronic component 7 stably. In such a case, the thickness of the laminate is insufficient in the gap between electronic component 7 and the contour of void 8, and when bonding LCP sheets 3 together through heating and compression, unevenness may occur at the surface of a resin multilayer substrate, or the shape of surrounding wiring lines (conductive pattern 31) may be distorted (see FIG. 4B). Then, after arranging electronic component 7 in the void, filling the gap between electronic component 7 and the contour of the void with LCP paste 60 of the present disclosure as shown in FIG. 5A, the insufficiency in thickness at the gap portion can be solved, and resin multilayer substrate 91 in which the surface after lamination has flatness can be obtained as shown in FIG. 5B. Moreover, electronic component 7 is restrained from moving unnecessarily in the void. In the present disclosure, such a void corresponds to the above-described "region insufficient in thickness when a plurality of resin sheets are laminated", and the portion formed by the LCP paste filling such a void is also included in thickness adjustment layer 62 (see FIG. 5B).

EXAMPLES

Although the present disclosure will be described below in more detail illustrating examples, the present disclosure is not limited to these.

Example 1

Figure 6:
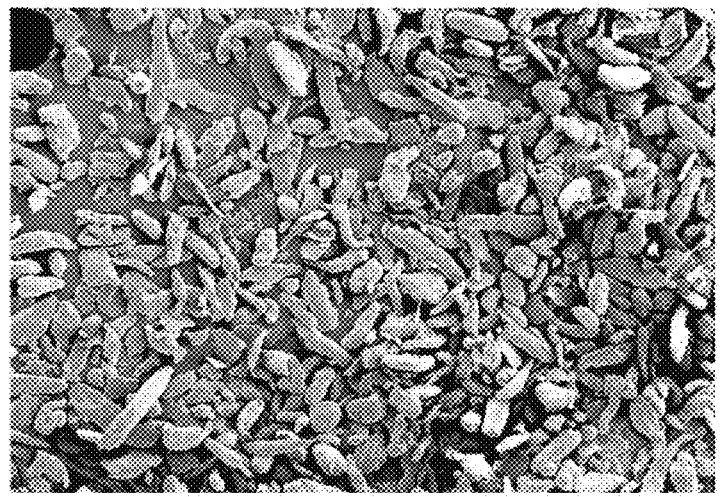
FIG. 6 is a SEM inspection image of LCP particles in Example 1 (before fibrillation).

An LCP biaxially-stretched film (125-µm-thick) was prepared, and this film was ground using a rotary cutter mill. After grinding, only particles having been ground until they could pass through a 0.5-mm-diameter mesh was collected to obtain an LCP powder. A SEM inspection image of particles in the obtained LCP powder is shown in FIG. 6. The obtained LCP powder had a 106-µm-mesh transmission coefficient (weight) of 15%, and a 150-µm-mesh transmission coefficient of 20%.

Figure 7:
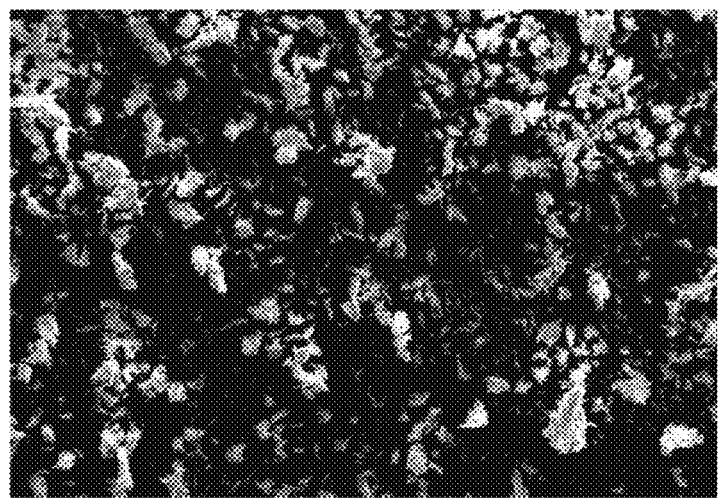
FIG. 7 is a SEM inspection image of fibrillated LCP particles obtained in Example 1.

Next, a dispersion obtained by adding the LCP powder (having passed through a 150 mesh) in a weight ratio of 10% to a dispersion medium (50% aqueous solution of ethanol) was prepared, and the LCP powder was fibrillated using a wet high-pressure crushing device. A 250-µm-diameter cross-type nozzle was used as a nozzle of the wet high-pressure crushing device, and processing of supplying the dispersion under a pressure of 125 MPa to pass through the nozzle was repeated 9 times. After the processing was repeated 9 times, sedimentation of a solid content was no longer observed even when the dispersion was left at rest. Then, the operation was terminated. The dispersion after this processing was dried with a spray dryer to obtain a fibrillated LCP powder. A SEM inspection image of particles in the obtained fibrillated LCP powder is shown in FIG. 7. As a result of SEM observation, this fibrillated LCP powder had a size of less than or equal to 100 µm at the maximum.

This fibrillated LCP powder was added in a weight ratio of 10% to terpineol, and stirred to obtain a paste-like material. While terpineol had a viscosity of about 70 mPa·s, the obtained paste-like material had a viscosity of about 3800 mPa·s. Even when this paste-like material was left for 1 day, sedimentation of a solid content was not observed.

As described above, in Example 1, a fine fibrillated powder whose overall shape was massive, rather than fibrous with a large aspect ratio and whose maximum diameter was less than or equal to 100 µm was obtained. This is because, since a biaxially-stretched film has a random molecular orientation in a plane, the film is ground without necessarily having anisotropy at the time of grinding to have massive particles having a small aspect ratio, and in addition, it is an aggregate of small domains in the inside in which a certain amount of molecules are oriented identically, and those domains are separated by a shearing force produced at the time of passage through a nozzle under high pressure. In order to obtain high pressure, the inside diameter of the nozzle is about 500 µm at the maximum, and a raw material fed into the device needs to be particles of less than or equal to 250 µm at the maximum. Such fine particles cannot be obtained from crushed fiber or pellet.

The obtained fibrillated LCP powder is bulky and has a large surface area, and fibrils are entangled together. Thus, even if it is added by a small amount to obtain a dispersion, sedimentation is unlikely to occur, and a viscosity increase effect is high.

Example 2

Figure 8:
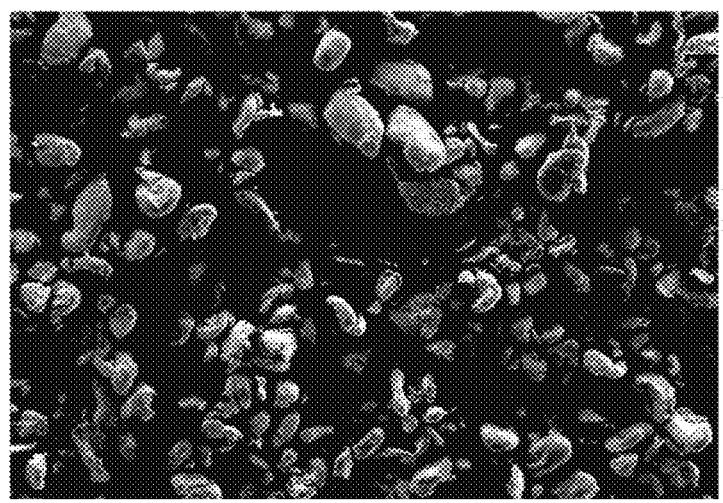
FIG. 8 is a SEM inspection image of LCP particles in Example 2 (before fibrillation).

An LCP biaxially-stretched film (125-µm-thick) similar to that of Example 1 was prepared, and primary grinding of this film was performed using a rotary cutter mill. After primary grinding, only films ground until they could pass through a 3-mm-diameter mesh were collected, and further, secondary grinding was performed using a freeze grinding machine to obtain an LCP powder. A SEM inspection image of particles in the obtained LCP powder is shown in FIG. 8. The obtained LCP powder had a 106-µm-mesh transmission coefficient (weight) of 67% and a 150-µm-mesh transmission coefficient of 90%. Thereafter, a fibrillated LCP powder and a paste-like material were obtained similarly to Example 1.

In this way, in Example 2, the yield when obtaining a powder of less than or equal to 150 µm from a film was dramatically increased, and besides, a fibrillated powder equivalent to Example 1 was obtained ultimately.

Example 3

An LCP biaxially-stretched film (125-µm-thick) was prepared, and primary grinding of this film was performed using a rotary cutter mill. After primary grinding, only films ground until they could pass through a 3-mm-diameter mesh were collected, and further, secondary grinding was performed using a freeze grinding machine to obtain an LCP powder. The obtained LCP powder had a 106-μm-mesh transmission coefficient (weight) of 67% and a 150-μm-mesh transmission coefficient of 90%.

Next, a dispersion obtained by adding an LCP powder (having passed through a 150 mesh) in a weight ratio of 10% to a dispersion medium (50% aqueous solution of ethanol) was prepared, and the LCP powder was fibrillated using a wet high-pressure crushing device. A 250-μm-diameter cross-type nozzle was used as a nozzle of the wet high-pressure crushing device, and processing of supplying the dispersion under a pressure of 125 MPa to pass through the nozzle was repeated 9 times. The dispersion after the processing by the wet high-pressure crushing device was dried with a spray dryer to obtain a fibrillated LCP powder.

This fibrillated LCP powder was added in a weight ratio of 15% to terpineol (having a viscosity of about 70 mPa·s), and stirred to obtain a paste-like material. The obtained paste-like material had a viscosity of about 14000 mPa·s. Even when this paste-like material was left for 1 day, precipitation of a solid content was not observed.

This paste was applied to a 125-μm-thick LCP sheet by screen printing (70 screen meshes/inch, 263-μm opening) to form an applied film, and then drying was performed under the conditions of 180° C. and 10 minutes on a hot plate to obtain an applied film having a thickness of about 30 m made only of a fibrillated LCP.

Tape Peel Test (Cross-Cut Test)

Figure 9:
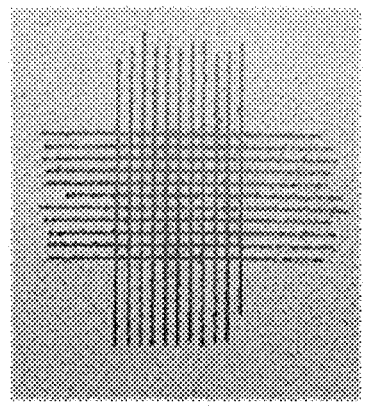
FIG. 9 is a photograph showing the result of a tape peel test in Example 3.

Using a crosscut guide, this applied film after drying was cut to have 1×1-mm squares in a grid pattern of 10×10, and a tape peel test was performed using a 15-mm-width mending tape available from 3M company (product name: Scotch® 810 Magic™ Tape). The procedure of the tape peel test was in conformity with "JIS K5400 cross-cut test method." The points in this cross-cut test method (cross-cut test points) are shown in Table 1. A photograph of the applied film after the tape peel test is shown in FIG. 9.

T-Peel Test

On the surface of the LCP sheet with the above-described applied film formed thereon, an LCP sheet having the same thickness of 125 μm was overlaid, and was pressed under the conditions of 280° C., 4 MPa and 5 minutes using a vacuum press device. The pressed sample was cut into 5-mm width, and a T-peel test was carried out using a tensile testing machine. The results of measurement of the peel strength in this test are shown in Table 1.

Evaluation of Electrode Level Difference

Furthermore, a quasi-resin multilayer substrate was produced using the following technique, and the electrode level difference was evaluated.

First, a base material on which a circuit pattern was to be formed was prepared by bonding an 18-μm-thick electrolytic copper foil (a laminate surface having been roughened) by thermocompression to one side of a 50-μm-thick LCP sheet.

Next, as a simulation circuit pattern, a 9-mm-width linear pattern was formed at intervals of 10 mm by etching the copper foil with an etching masking tape attached.

Next, an applied film was formed on the circuit pattern from which the masking tape had not been peeled using a printing screen similar to that when forming the above-described applied film, and after peeling the masking tape, the film was dried under the same conditions as described above. A 30-μm-thick applied film was thereby formed on portions other than a conductor portion of the simulation circuit pattern.

Next, two simulation circuit patterns with the above-described applied film formed thereon were placed one on the other such that their patterns overlapped, and a 50-μm-thick LCP sheet was further overlaid, and pressing was performed under the conditions of 280° C., 4 MPa and 5 minutes using a vacuum press device.

Next, the thickness was measured at six points each at a place directly above the conductor portion and at a portion where the conductor was absent, and the difference between average values was defined as a level difference. The results of measurement of level difference are shown in Table 1.

Results of evaluation of respective tests of Examples 4, 5 and Comparative Examples 1 to 4 are similarly shown in Table 1 collectively.

Comparative Example 1

Figure 10:
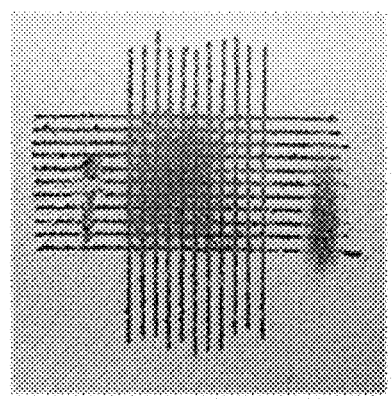
FIG. 10 is a photograph showing the result of a tape peel test in Comparative Example 1.

As a comparison, a paste-like material was obtained similarly to Example 3 except that an unfibrillated LCP powder (an LCP powder before being processed by a wet high-pressure crushing device) was used instead of a fibrillated powder, and that this LCP powder was added in a weight ratio of 10% to terpineol. This paste-like material was evaluated similarly to Example 3. A photograph of the applied film after the tape peel test is shown in FIG. 10.

Comparative Example 4

A sample for peel strength measurement and a simulation resin multilayer substrate were produced similarly to Comparative Example 3 except that a paste was not used, and the peel strength and the level difference were measured similarly to Example 3.

The above results (particularly the result of Comparative Example 1 (FIG. 10) and the result of Example 3 (FIG. 9)) reveal that in Example 3, the applied film after drying exhibits high adhesion on an LCP sheet because of entanglement between fibrils and bonding strength between fibrillated particles and between the fibrillated particles and the film, and do not easily fall down.

Example 4

A fibrillated powder was obtained by a method similar to that of Example 3. Moreover, an LCP powder (not having been subjected to fibrillation) obtained by freeze grinding was separately classified by a 40-μm mesh to obtain a fine LCP powder.

As to these powders, the fibrillated LCP powder and the fine LCP powder were mixed at a ratio of 1 to 3, and this powder mixture was added in a weight ratio of 25% to terpineol, and stirred to obtain a paste-like material. This paste-like material was subjected to an evaluation test similarly to Example 3.

Comparative Example 2

As a comparison, a paste-like material was obtained and this paste-like material was evaluated similarly to Example 4 except that an unfibrillated LCP powder (a powder before being processed by a wet high-pressure crushing device in the fibrillated powder manufacturing process) was used instead of the fibrillated powder and was added by 25% to terpineol. From the above results, in Example 4, the solid content ratio could be increased with the same viscosity, in addition to the effect of Example 3. A thicker applied film can thereby be formed with equivalent workability. By adding an LCP powder not having been subjected to the fibrillating step, costs for forming an applied film of the same thickness can be reduced.

Example 5

By a method similar to that of Example 4, a powder mixture of a fibrillated LCP powder and a fine LCP powder was obtained. This powder mixture was subjected to UV treatment. Specifically, the powder mixture was added by 5 wt % to a dispersion medium of ethanol and water in the ratio 1:1, and stirred to obtain a dispersion. With this dispersion interposed between two 5-mm-thick synthetic quartz plates, UV irradiation was carried out from the both sides with a low pressure mercury lamp under the condition of 2000 mJ/cm (254-nm wavelength) on each side, and dried with a spray dryer to obtain a powdery material.

A paste of this powdery material (a mixture of a fibrillated LCP powder and a fine LCP powder) was obtained by a method similar to that of Example 4, and evaluated similarly to Example 4.

Comparative Example 3

A paste-like material was obtained similarly to Comparative Example 2 except that an LCP powder was subjected to UV treatment, and this paste-like material was evaluated.

The above results reveal that, in Example 5, adhesiveness after compression increased and high peel strength appeared because of the UV treatment, in addition to the effect of Example 4.

ductive pattern; 41 conductive paste; 42 via conductor; 5 resist film; 60 LCP paste; 61 LCP powder layer; 62 thickness adjustment layer; 7 electronic component; 8 void (cavity); 90 laminate; 91 resin multilayer substrate.

The invention claimed is:

1. A method of producing a fibrillated liquid crystal polymer powder containing fibrillated liquid crystal polymer particles, comprising, in the following order:
   a grinding step of grinding a biaxially-oriented liquid crystal polymer film to obtain a ground liquid crystal polymer powder having a particle size of 0.1 μm to 300 μm;
   a dispersion preparing step of dispersing the ground liquid crystal polymer powder into a dispersion medium to prepare a dispersion of the ground liquid crystal polymer powder, wherein the dispersion medium has a boiling point not exceeding a melting point of the ground liquid crystal polymer powder;
   a fibrillating step of causing the dispersion of the ground liquid crystal polymer powder to pass through a nozzle under high pressure to crush the ground liquid crystal polymer powder by a wet high-pressure crushing device to obtain the fibrillated liquid crystal polymer powder; and
   a dispersion medium removing step of removing the dispersion medium to collect the fibrillated liquid crystal polymer powder.

2. The method of producing the fibrillated liquid crystal polymer powder according to claim 1, wherein grinding using a freeze grinding method is performed in the grinding step.

* * * * *

TABLE 1

| | Example 3 | Comparative Example 1 | Example 4 | Comparative Example 2 | Example 5 | Comparative Example 3 | Comparative Example 4 |
|---|---|---|---|---|---|---|---|
| Fibrillation | performed | not performed | performed | not performed | performed | not performed | — |
| Powder UV Treatment | not performed | not performed | not performed | not performed | performed | performed | — |
| Solid Content Concentration (wt %) | 15 | 15 | 25 | 25 | 25 | 25 | — |
| Deposition | absent | present | absent | present | absent | present | — |
| Viscosity (mPa · s) | 13800 | 400 | 15000 | 600 | 15000 | 600 | — |
| Cross-Cut Test Point | 10 | 0 | 10 | 0 | 10 | 0 | — |
| Peel Strength (N/mm) | 0.13 | 0.12 | 0.13 | 0.13 | 0.51 | 0.49 | 0.50 |
| Level Difference (μm) | 10 | 10 | 5 | 6 | 4 | 5 | 35 |

It should be understood that the embodiments disclosed herein are illustrative and non-restrictive in every respect. The scope of the present disclosure is defined by the claims not by the description above, and is intended to include any modification within the meaning and scope equivalent to the terms of the claims.

REFERENCE SIGNS LIST

1 resin sheet with conductor foil; 2 resin sheet; 2a principal surface; 3 LCP sheet; 30 conductor foil; 31 con-